United States Patent
Huang et al.

(10) Patent No.: US 7,800,907 B2
(45) Date of Patent: Sep. 21, 2010

(54) COMMUNICATION CHASSIS HEAT DISSIPATION STRUCTURE

(75) Inventors: Chiu-Mao Huang, Sinjhuang (TW); Chang-Moou Huang, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 0 days.

(21) Appl. No.: 12/409,851

(22) Filed: Mar. 24, 2009

(65) Prior Publication Data
US 2010/0208428 A1  Aug. 19, 2010

(30) Foreign Application Priority Data
Feb. 13, 2009  (TW) ............... 98202144 U

(51) Int. Cl.
*H05K 7/20* (2006.01)
(52) U.S. Cl. ............ 361/700; 361/699; 361/704; 174/15.2; 165/80.4; 165/104.26
(58) Field of Classification Search ............ None
See application file for complete search history.

(56) References Cited

U.S. PATENT DOCUMENTS

| | | | |
|---|---|---|---|
| 5,398,161 A | | 3/1995 | Roy |
| 5,818,693 A | * | 10/1998 | Garner et al. ............ 361/700 |
| 6,104,611 A | * | 8/2000 | Glover et al. ............ 361/700 |
| 6,724,617 B2 | * | 4/2004 | Amaike et al. ........... 361/679.4 |
| 7,019,967 B2 | * | 3/2006 | DiFonzo et al. ........ 361/679.52 |
| 7,130,193 B2 | * | 10/2006 | Hirafuji et al. ............ 361/700 |
| 7,133,284 B2 | * | 11/2006 | Lee ............ 361/697 |
| 7,277,282 B2 | * | 10/2007 | Tate ............ 361/697 |
| 7,365,982 B2 | * | 4/2008 | He ............ 361/700 |
| 7,423,875 B2 | * | 9/2008 | Huang et al. ............ 361/699 |
| 7,586,741 B2 | * | 9/2009 | Matsushima et al. ... 361/679.47 |
| 7,606,030 B2 | * | 10/2009 | Zhou et al. ............ 361/700 |
| 7,631,686 B2 | * | 12/2009 | He et al. ............ 165/104.33 |
| 2004/0228093 A1 | * | 11/2004 | Lee ............ 361/701 |
| 2007/0263355 A1 | * | 11/2007 | Yu et al. ............ 361/700 |
| 2008/0043425 A1 | * | 2/2008 | Hebert et al. ............ 361/687 |
| 2008/0212285 A1 | * | 9/2008 | Sun ............ 361/710 |
| 2009/0009969 A1 | * | 1/2009 | Chu ............ 361/700 |

* cited by examiner

*Primary Examiner*—Boris L Chervinsky

(57) ABSTRACT

A communication chassis heat dissipation structure includes a chassis body defining an inner receiving space. The chassis body is divided into at least one heat concentration portion and at least one heat dissipation portion. A first heat pipe set is arranged in the receiving space to extend between and connect to the heat concentration portion and the heat dissipation portion, so that heat absorbed by the heat concentration portion is quickly transferred via the first heat pipe set to the heat dissipation portion and then dissipates from the heat dissipation portion into ambient air. Therefore, heat inside the chassis body can be quickly dissipated outward, enabling a communication chassis to have excellent heat dissipation effect.

11 Claims, 6 Drawing Sheets

COMMUNICATION CHASSIS HEAT DISSIPATION STRUCTURE

FIELD OF THE INVENTION

The present invention relates to a communication chassis heat dissipation structure, and more particularly to a communication chassis heat dissipation structure that includes a first heat pipe set for absorbing heat concentrated at a heat concentration portion and transferring the absorbed heat to a heat dissipation portion having a large heat dissipating area, so that heat produced in the communication chassis can be quickly dissipated into ambient air.

BACKGROUND OF THE INVENTION

It is known that electronic communication equipment is conventionally enclosed in a communication chassis. When the electronic devices of the communication equipment operate, heat is produced at the same time. The communication chassis is a closed enclosure generally made of a metal material through one-step cast-molding process. However, being limited by the currently available casting techniques, the metal communication chassis usually has relatively low heat conductivity. As a result, heat produced by the electronic devices during operation thereof tends to accumulate in and concentrated at some particular areas of the communication chassis. The accumulated heat results in a relatively high temperature at these areas and can not be easily dissipated from the closed communication chassis. When the temperature exceeds the range that can be accepted by the electronic devices of the communication equipment, the reliability or service life of the communication equipment would be seriously adversely affected. However, for other areas in the communication chassis farther away from the heat-producing electronic devices, the temperature is much lower than that in those areas closer to or contacting with the electronic devices of the communication equipment.

That is, the temperature distribution in the conventional communication chassis is extremely uneven to largely reduce an overall heat dissipation performance of the whole communication chassis. The currently available solutions for the above problems generally include enlarging an internal space of the communication chassis and improving the communication chassis material. However, these solutions would inevitably result in a bulky and heavy communication chassis.

It is therefore important to work out a way that can enhance the heat dissipation performance of the communication chassis without increasing its dimensions and weight.

FIG. 1 is an exploded perspective view of a conventional communication chassis, which includes a chassis body 10, a cover 11, two pairs of supporting posts 12, and a machine board 13. The chassis body 10 defines an inner receiving space 101, and is provided on an outer surface apposite to the receiving space 101 with a plurality of radiating fins 103. The supporting posts 12 are arranged in the receiving space 101 close to one side of the chassis body 10. The machine board 13 has a plurality of heat-producing electronic elements 131 mounted thereon and is connected to and accordingly supported on a top of the supporting posts 12. The cover 11 is connected to an open side of chassis body 10 to seal the receiving space 101. That is, the cover 11 and the chassis body 10 together enclose a closed receiving space 101 therein.

The heat-producing elements 131 can include, for example, different chips, a central processing unit (CPU), and other integrated circuits (ICs). When these heat-producing elements 131 on the machine board 13 operate in the communication chassis, a large amount of high-temperature heat is produced. The produced heat is accumulated in the closed receiving space 101 and could not be quickly dissipated therefrom. The accumulated heat can only be transferred to the chassis body 10 and the radiating fins 103 outside the chassis body 10 via heat radiation. Since the heat-producing elements 131 on the machine board 13 are not in contact with any other heat conducting media, such as heat pipes or other heat-conducting elements, the heat produced by the heat-producing elements 131 could not be quickly transferred to the radiating fins 103 for dissipation. In brief, the heat in the communication chassis could not quickly diffuse outward and tends to damage the heat-producing elements 131 and interrupt computing process of the electronic communication equipment, resulting in poor communication signal quality. In some worse conditions, the heat-producing elements 131 would be burned-out or have shortened service life.

According to the above description, the conventional communication chassis has the following disadvantages: (1) having poor heat dissipation effect; (2) easy to cause abnormal operation of the electronic communication equipment; (3) tending to cause poor communication signal quality; (4) tending to shorten the service life of the electronic communication equipment; and (5) having high damage rate.

It is therefore tried by the inventor to develop a communication chassis heat dissipation structure to overcome the problems in the conventional communication chassis.

SUMMARY OF THE INVENTION

A primary object of the present invention is to provide a communication chassis heat dissipation structure that provides excellent heat dissipation effect.

Another object of the present invention is to provide a communication chassis heat dissipation structure that enables communication equipment to have increased service life.

A further object of the present invention is to provide a communication chassis heat dissipation structure that is helpful in maintaining received and transmitted signals in stable signal quality.

A still further object of the present invention is to provide a communication chassis heat dissipation structure that provides a large heat conducting area to enable uniform heat conduction.

To achieve the above and other objects, the communication chassis heat dissipation structure according to a preferred embodiment of the present invention includes a chassis body, which defines an inner receiving space and is divided into at least one heat concentration portion and at least one heat dissipation portion; and a first heat pipe set installed on the chassis body and located in the receiving space to extend between and connect to the heat concentration portion and the heat dissipation portion. The first heat pipe set includes a plurality of first heat pipes. Each of the first heat pipes has a first heat absorbing end and a first heat dissipating end. Heat absorbed by the heat concentration portion is guided by the first heat absorbing ends to the first heat dissipating ends, and then further transferred from the first heat dissipating ends to the heat dissipation portion. Since the heat dissipation portion provides a large heat conducting area, heat transferred thereto can be efficiently and uniformly dissipated into ambient air. Therefore, excellent heat dissipation effect can be achieved with the communication chassis.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
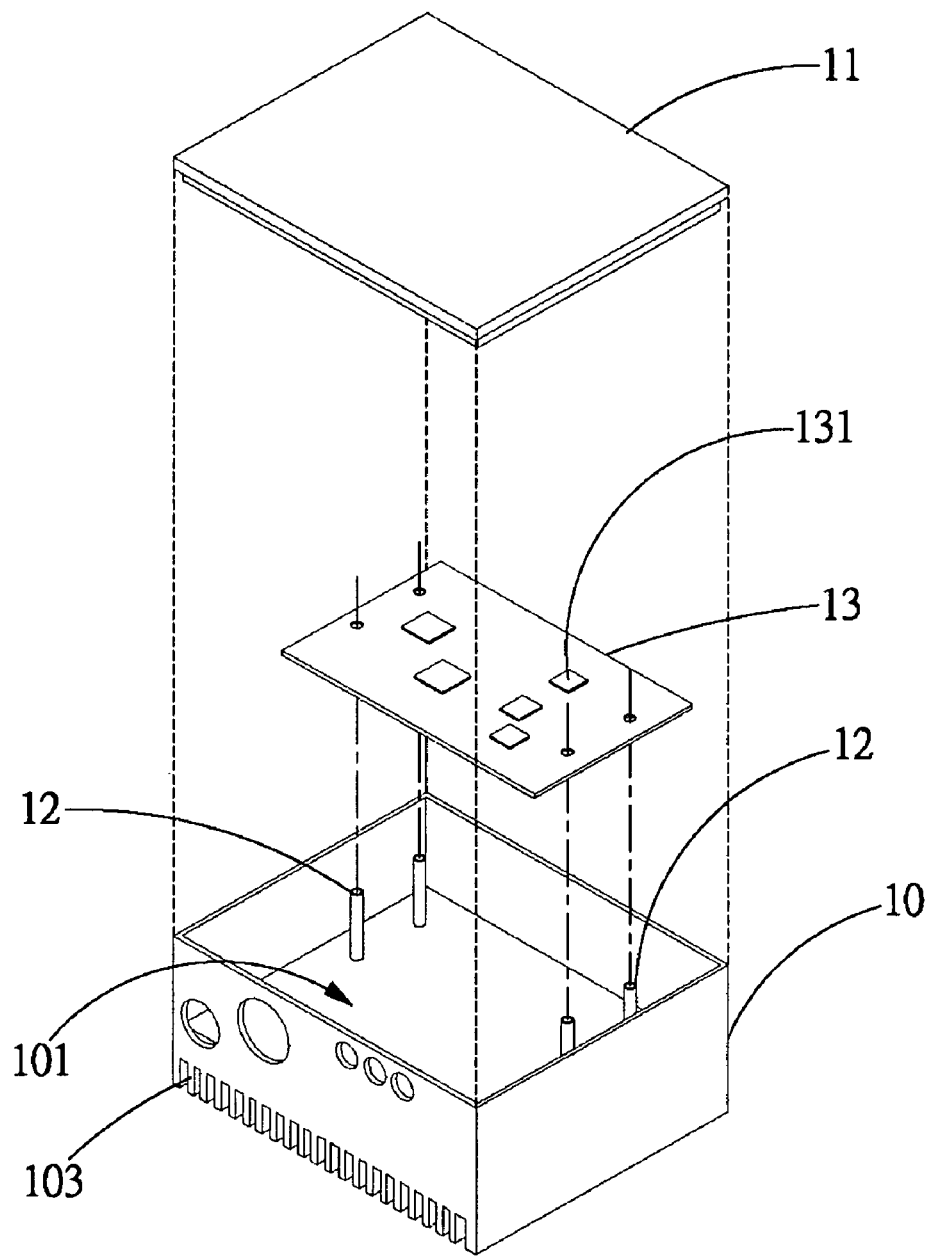
FIG. 1 is an exploded perspective view of a conventional communication chassis.
Figure 2:
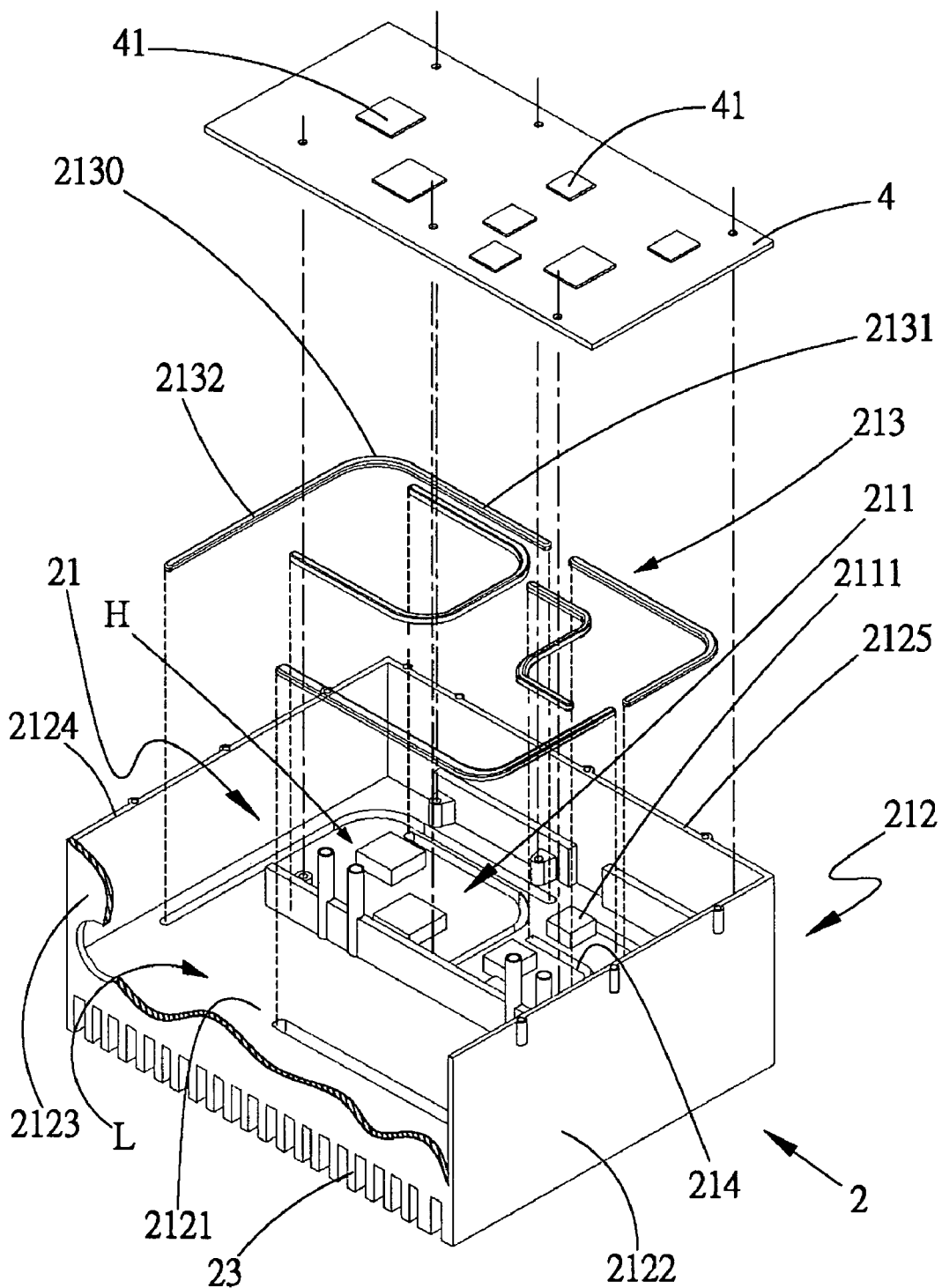
FIG. 2 is an exploded perspective view showing a chassis body, a plurality of heat pipes, and a machine board included in a communication chassis heat dissipation structure according to the present invention.

Please refer to FIG. 2. A communication chassis heat dissipation structure according to the present invention includes a chassis body 2, which defines an inner receiving space 21 therein and has a plurality of radiating fins 23 provided on an outer surface facing away from the inner receiving space 21. The chassis body 2 is divided into at least one heat concentration portion 211 and at least one heat dissipation portion 212. A first heat pipe set 213 is arranged in the receiving space 21 to extend between and connect to the heat concentration portion 211 and the heat dissipation portion 212, allowing heat absorbed by the heat concentration portion 211 to be transferred to the heat dissipation portion 212 via the first pipe set 213 and finally radiate or dissipate from the heat dissipation portion 212.

The first heat pipe set 213 includes a plurality of first heat pipes 2130, which each have a first heat absorbing end 2131 and a first heat dissipating end 2132. The first heat absorbing ends 2131 absorb the heat concentrated at the heat concentration portion 211, and the heat absorbed by the first heat absorbing ends 2131 is then transferred to the first heat dissipating ends 2132 through heat conduction via the first heat pipes 2130. That is, the first heat absorbing ends 2131 quickly transfer the heat absorbed by the heat concentration portion 211 to the first heat dissipating ends 2132, so that the heat transferred to the first heat dissipating ends 2132 can be further widely transferred to the heat dissipation portion 212 and other areas on the chassis body 2 and be dissipated therefrom. By providing the first heat pipe set 213, heat can be effectively and evenly guided to and distributed over the heat dissipation portion 212 and other areas on the chassis body 2. With the large heat dissipation area of the chassis body 2, upgraded heat conducting efficiency can be obtained to achieve improved heat dissipation effect.

Figure 3:
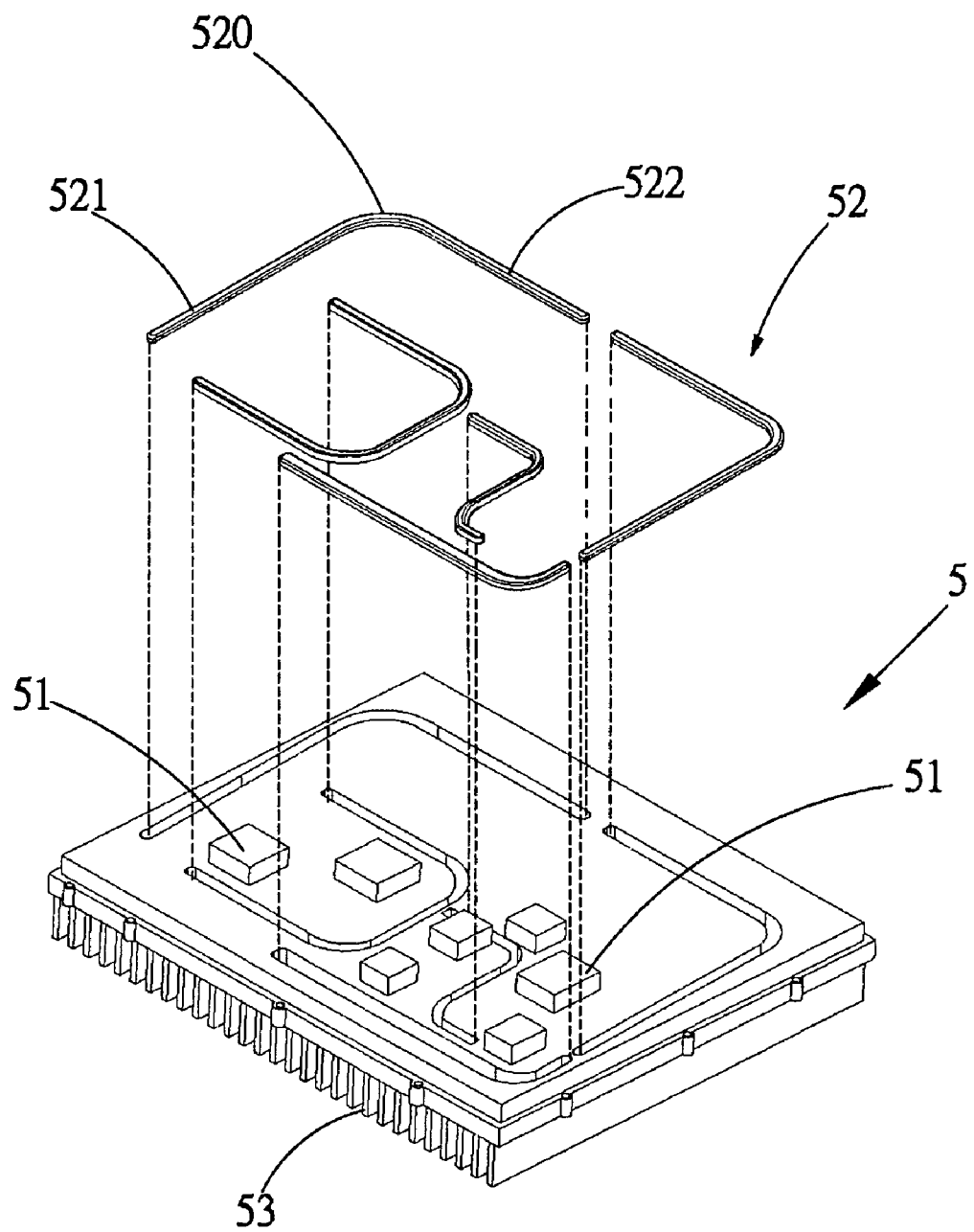
FIG. 3 is an exploded perspective view of a cover for the communication chassis heat dissipation structure of the present invention.
Figure 4:
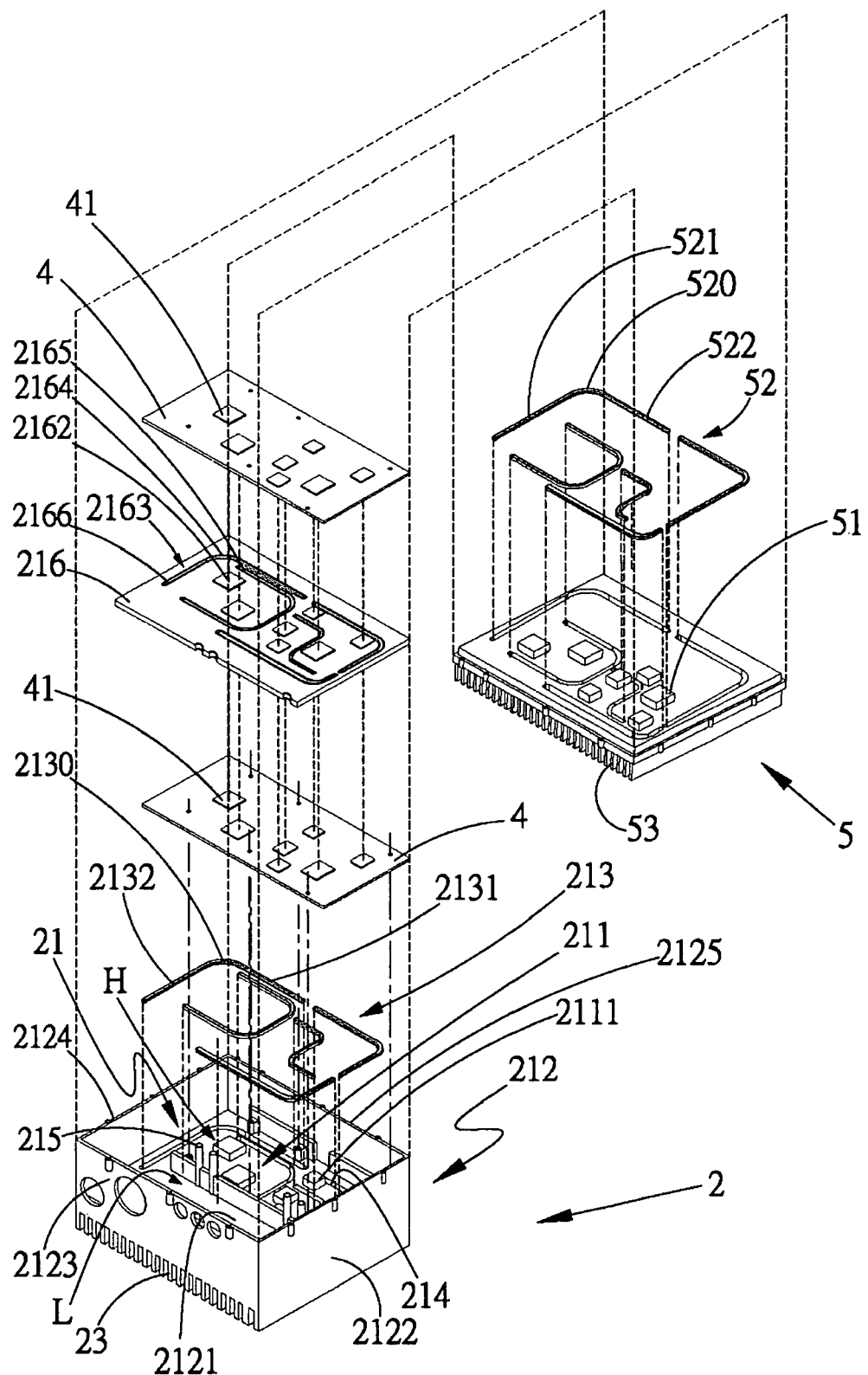
FIG. 4 is an exploded perspective view of the communication chassis heat dissipation structure according to a preferred embodiment of the present invention.
Figure 5:
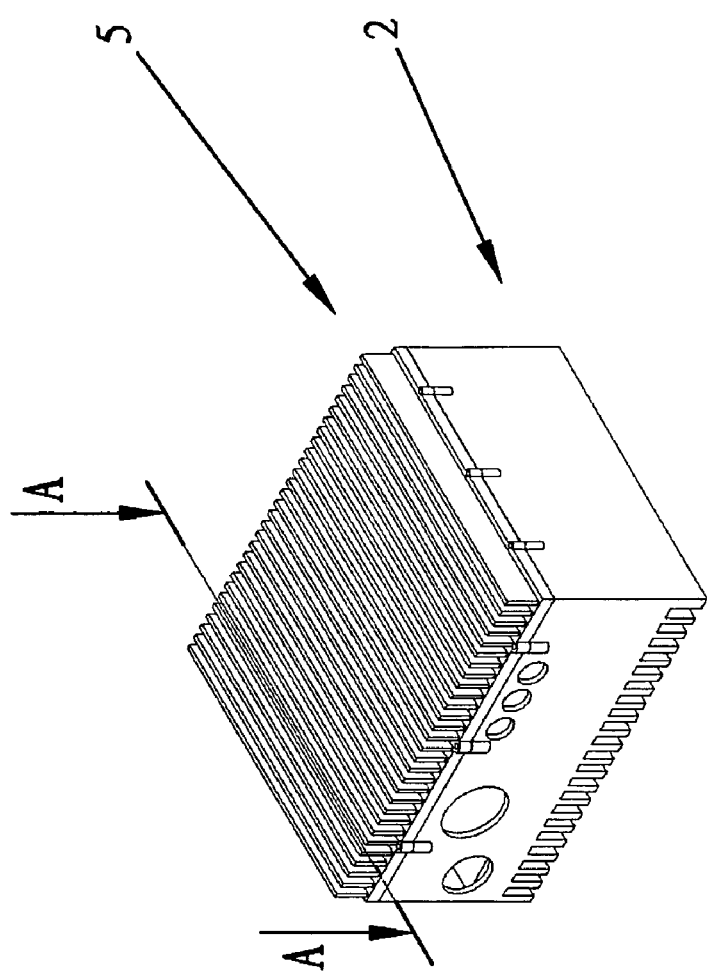
FIG. 5 is an assembled view of FIG. 4.
Figure 5A:
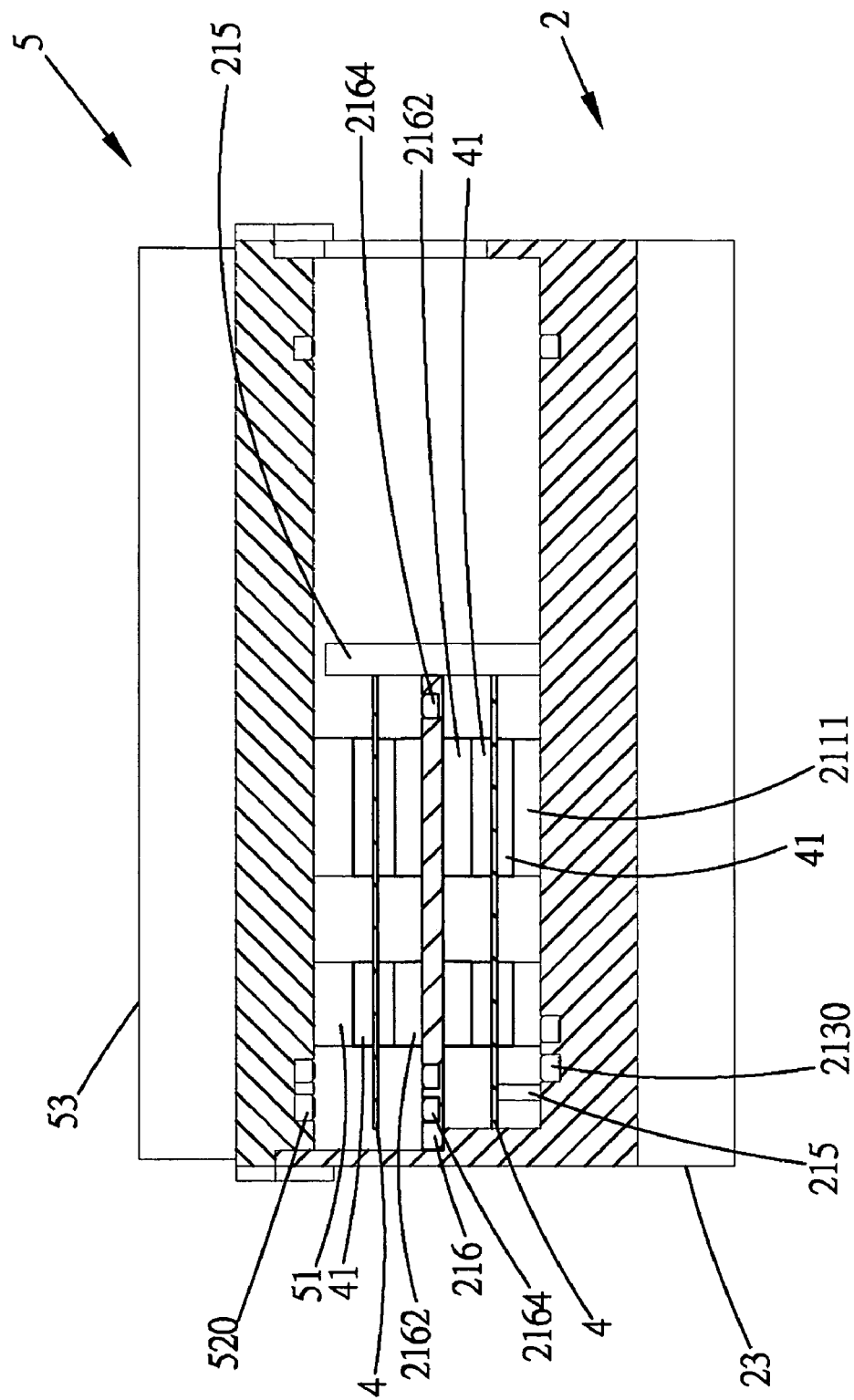
FIG. 5A is a cross-sectional view taken along line A-A of FIG. 5.

FIGS. 4 and 5 are exploded and assembled perspective views, respectively, of a communication chassis heat dissipation structure according to a preferred embodiment of the present invention, FIG. 3 is an exploded perspective view of a cover for the communication chassis heat dissipation structure of FIG. 4, and FIG. 5A is a cross sectional view taken along line A-A of FIG. 5. Please refer to FIGS. 3, 4, 5 and 5A. In the heat concentration portion 211, there is provided at least one first raised area 2111 for contacting with at least one heat-producing element 41 aligned therewith, so that a hot zone H is formed at the first raised area 2111. That is, when the first raised area 2111 absorbs heat produced by the heat-producing element 41, the first raised area 2111 becomes a high-temperature area in the receiving space 21 and thereby forms a hot zone H on the chassis body 2. It is noted the first heat absorbing ends 2131 are closer to the first raised area 2111 and the first heat dissipating ends 2132 are farther away from the first raised area 2111.

The heat dissipation portion 212 includes a first heat dissipation section 2121, a second heat dissipation section 2122, a third heat dissipation section 2123, a fourth heat dissipation section 2124, and a fifth heat dissipation section 2125. These heat dissipation sections 2121 to 2125 are connected to one another to constitute a cold zone L. The cold zone L is distant from the hot zone H without contacting with any heat-producing element 41, and therefore becomes a low-temperature heat dissipation area in the receiving space 21. In the illustrated preferred embodiment, the first heat dissipation section 2121 is a section on a bottom of the receiving space 21 opposite to and distant from the heat concentration portion 211. The second to the fifth heat dissipation section 2122~2125 are successively connected to one another to locate around the receiving space 21. In other words, the second heat dissipation section 2122 has two lateral edges separately connected to one lateral edge of the third heat dissipation section 2123 and the fifth heat dissipation section 2125, and the other lateral edge of the third and the fifth heat dissipation section 2123, 2125 are separately connected to two lateral edges of the fourth heat dissipation section 2124.

On an inner surface of the chassis body 2, there can be provided at least one groove 219 for receiving the first heat pipes 2130 therein. A part of the at least one groove 214 is located adjacent to the at least one raised area 2111 and around the heat concentration portion 211, and the remaining part of the at least one groove 214 is located adjacent to the heat dissipation portion 212 and around the chassis body 2. In brief, a part of the at least one groove 214 for receiving the first heat absorbing ends 2131 of the first heat pipes 2130 is extended adjoining the at least one raised area 2111 and around the heat concentration portion 211, while the remaining part of the at least one groove 214 for receiving the first heat dissipating ends 2132 of the first heat pipes 2130 is located distant from the at least one raised area 2111 and in contact with the heat dissipation portion 212 and the chassis body 2. Moreover, at least one machine board 4 is held in the receiving space 21, and the at least one heat-producing element 41 is provided on the machine board 4. In the illustrated embodiment, two machine boards 4 are shown.

As can be seen from FIG. 4, there is also at least one support element 215 and at least one heat-conducting element 216 provided in the receiving space 21. The support element 215 is located in the receiving space 21 of the chassis body 2 for supporting the at least one machine board 4 thereon, so that the machine board 4 can be stably held in the receiving space 21. Meanwhile, heat produced by the at least one heat-producing element 41 on the machine board 4 can also be transferred via the at least one support element 215 to the chassis body 2 and finally radiate from the radiating fins 23 on the outer surface of the chassis body 2 into ambient air.

The heat-conducting element 216 is arranged between two adjacent machine boards 4 with one end tightly abutted on an inner surface of the chassis body 2. The heat-conducting element 216 is provided on two opposite faces with at least one second raised area 2162 each for contacting with the heat-producing elements 41 on the two adjacent machine boards 4, so that heat produced by the heat-producing elements 41 on the two machine boards 4 is transferred to and absorbed by the second raised areas 2162, and hot zones H are also formed on the heat-conducting element 216 at the second raised areas 2162. In the present invention, the heat-conducting element 216 can be a heat dissipating plate.

On one face of the heat-conducting element 216, a second heat pipe set 2163 can be further provided. The second heat pipe set 2163 includes a plurality of second heat pipes 2164, each of which has a second heat absorbing end 2165 closer to the at least one second raised area 2162 and a second heat dissipating end 2166 farther away from the at least one raised area 2162. The heat absorbed by the second heat absorbing ends 2165 can be transferred to the heat dissipation portion 212 via the second heat dissipating ends 2166. Therefore, heat produced by the heat-producing elements 41 and absorbed by the second raised areas 2162 is transferred from the second heat-absorbing ends 2165 to the second heat-dissipating ends 2166, and the second heat-dissipating ends 2166 further transfer the received heat to the heat dissipation portion 212, so that the heat is radiated from the heat dissipation portion 212 and dissipated into surround air. The radiating fins 23 on the outer surface of the chassis body 2 also assist in radiating the heat transferred to the chassis body 2. More specifically, most part of the heat transferred to the chassis body 2 is dissipated through radiation from the first to the fifth heat dissipation section 2121~2125 as well as heat exchange with cool ambient air, while the remaining part of the heat is dissipated via the radiating fins 23.

The communication chassis heat dissipation structure according to the present invention further includes a cover 5 correspondingly connected to an open side of the chassis body 2. The cover 5 has a first face facing toward the receiving space 21 and a second face facing away from the receiving space 21. The cover 5 is provided on the first face with at least one third raised area 51 and at least one third heat pipe set 52, and on the second face with a plurality of radiating fins 53. The third raised area 51 is in contact with the at least one heat-producing element 41 provided on the at least one machine board 4 to absorb heat produced by the heat-producing element 41, so that a hot zone H is formed at the third raised area 51.

The third heat pipe set 52 includes a plurality of third heat pipes 520, each of which has a third heat absorbing end 521 closer to the third raised area 51 and a third heat dissipating end 522 farther away from the third raised area 51. The third heat absorbing ends 521 can absorb heat and transfer the absorbed heat via the third heat dissipating ends 522 to the radiating fins 53 on the second face of the cover 5 and/or the heat dissipation portion 212. Therefore, the heat produced by the heat-producing element 41 and absorbed by the third raised area 51 is transferred from the third heat absorbing ends 521 to the third heat dissipating ends 522, and the third heat dissipating ends 522 further transfer the received heat to the heat dissipation portion 212 and the radiating fins 53 on the cover 5.

The function manner of the communication chassis heat dissipation structure according to the preferred embodiment of the present invention will now be described with reference to FIGS. 4, 5, and 5A.

During the operation thereof, the heat-producing elements 41 on the two machine boards 4 in the communication chassis will produce a large amount of heat. The first raised area 2111 on the heat concentration portion 211 absorbs the heat produced by the heat-producing element 41 on the at least one machine board 4, and the absorbed heat is transferred from the first heat absorbing ends 2131 of the first heat pipes 2130 to the first heat dissipating ends 2132. The heat transferred to the first heat dissipating ends 2132 is then widely transferred to the heat dissipation portion 212, that is, the first to the fifth heat dissipation sections 2121~2125. With the large area provided by the heat dissipation portion 212, the heat transferred to the heat dissipation portion 212 can be efficiently radiated therefrom and dissipated into ambient air. The radiating fins 23 provided on the chassis body 2 further assist in quick heat dissipation.

Meanwhile, the second raised areas 2162 on the heat-conducting element 216 absorb the heat produced by the heat-producing elements 41 on the machine boards 4, and the second heat absorbing ends 2165 of the second heat pipes 2164 guide the heat from the second raised areas 2162 to the second heat dissipating ends 2166. The second heat dissipating ends 2166 further transfer the received heat to the heat dissipation portion 212, so that the heat is evenly distributed over the first to the fifth heat dissipation section 2121~2125 and radiated to dissipate into ambient air. Again, the radiating fins 23 provided on the chassis body 2 further assist in quick heat dissipation.

At the same time, the at least one third raised area 51 on the cover 5 absorb heat produced by the at least one heat-producing elements 41 on the machine board 4 closer to the cover 5, and the third heat absorbing ends 521 of the third heat pipes 520 guide the absorbed heat from the third raised area 51 to the third heat dissipating ends 522. The third heat dissipating ends 522 further transfer the received heat to the heat dissipation portion 212, so that the heat is evenly distributed over the first to the fifth heat dissipation section 2121~2125 and radiated to dissipate into ambient air. Again, the radiating fins 53 provided on the cover 5 further assist in quick heat dissipation. Therefore, the communication chassis heat dissipation structure of the present invention provides excellent heat dissipation effect, allowing the machine boards 4 in the chassis body 2 to operate stably and provide good and stable communication signal quality while having extended usable life.

In brief, the communication chassis heat dissipation structure according to the present invention has the following advantages: (1) providing improved heat dissipation effect; (2) providing highly uniform heat conducting efficiency; (3) providing increased heat dissipation area; (4) providing upgraded stability of communication signal quality; and (5) enabling the communication equipment enclosed in the communication chassis to have extended usable life.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A communication chassis heat dissipation structure, comprising:

a chassis body being divided into at least one heat concentration portion and at least one heat dissipation portion, and a first heat pipe set being installed in the chassis body, wherein the chassis body is provided with at least one groove, into which the first heat pipe set is received; a part of the at least one groove being located adjacent to the at least one first raised area and around the heat concentration portion, and the remaining part of the at least one groove being located adjacent to the heat dissipation portion and around the chassis body;

the first heat pipe set being extended between and connected to the heat concentration portion and the heat dissipation portion for transferring heat absorbed by the heat concentration portion to the heat dissipation portion, so that the absorbed heat is dissipated into ambient air from the heat dissipation portion; and wherein the heat concentration portion is provided with at least one first raised area for contacting with at least one heat-producing element and forming a hot zone at the first raised area.

2. The communication chassis heat dissipation structure as claimed in claim 1, wherein the chassis body defines an inner receiving space.

3. The communication chassis heat dissipation structure as claimed in claim 1, wherein the first heat pipe set includes a plurality of first heat pipes, each of the first heat pipes having a first heat absorbing end and a first heat dissipating end; the first heat absorbing ends being closer to the at least one first raised area while the first heat dissipating ends being farther away from the at least one first raised area.

4. The communication chassis heat dissipation structure as claimed in claim 2, wherein the heat dissipation portion includes a first heat dissipation section, a second heat dissipation section, a third heat dissipation section, a fourth heat dissipation section, and a fifth heat dissipation section; the first to the fifth heat dissipation section being connected to one another to form a cold zone; the first heat dissipation section being a section on a bottom of the receiving space located distant from the heat concentration portion, and the second to the fifth heat dissipation section being successively connected together to locate around the receiving space.

5. The communication chassis heat dissipation structure as claimed in claim 2, wherein the receiving space has at least one machine board held therein, and the machine board each is provided with at least one heat-producing element.

6. The communication chassis heat dissipation structure as claimed in claim 2, wherein the chassis body is provided on an outer surface opposite to the receiving space with a plurality of radiating fins.

7. The communication chassis heat dissipation structure as claimed in claim 5, further comprising at least one support element and at least one heat-conducting element; the at least one support element being located in the receiving space of the chassis body for supporting the at least one machine board thereon; and the at least one heat-conducting element being arranged between two adjacent machine boards; the heat-conducting element being provided on two opposite faces with at least one second raised area each, and the second raised areas contacting with the heat-producing elements on the two machine boards to form hot zones at the second raised areas.

8. The communication chassis heat dissipation structure as claimed in claim 7, further comprising a second heat pipe set arranged on the heat-conducting element; the second heat pipe set including a plurality of second heat pipes, each of the second heat pipes having a second heat absorbing end and a second heat dissipating end; the second heat absorbing ends being closer to the second raised areas while the second heat dissipating ends being farther away from the second raised areas; and heat absorbed by the second heat absorbing ends being transferred from the second heat absorbing ends to the heat dissipation portion via the second heat dissipating ends.

9. The communication chassis heat dissipation structure as claimed in claim 2, further comprising a cover connected to an open side of the chassis body; the cover being provided on a first face facing toward the receiving space with at least one third raised area, and on an opposite second face facing away from the receiving space with a plurality of radiating fins; and the third raised area contacting with at least one heat-producing element, so that a hot zone is formed at the third raised area.

10. The communication chassis heat dissipation structure as claimed in claim 9, further comprising a third heat pipe set arranged on the cover; the third heat pipe set including a plurality of third heat pipes, and each of the third heat pipes having a third heat absorbing end and a third heat dissipating end; the third heat absorbing ends being closer to the third raised area while the third heat dissipating ends being farther away from the third raised area; and heat absorbed by the third heat absorbing ends being transferred from the third heat absorbing ends to the radiating fins on the cover and/or the heat dissipation portion via the third heat dissipating ends.

11. The communication chassis heat dissipation structure as claimed in claim 1, wherein the chassis body defines an inner receiving space, in which at least one machine board is held; and the at least one heat-producing element being arranged on the at least one machine board.

* * * * *